(12) United States Patent
Kaihori

(10) Patent No.: US 7,439,534 B2
(45) Date of Patent: Oct. 21, 2008

(54) REFLECTED LIGHT INTENSITY RATIO MEASURING DEVICE, DEVICE FOR MEASURING LIGHT ENERGY ABSORPTION RATIO AND HEAT TREATMENT APPARATUS

(75) Inventor: Hirotsugu Kaihori, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 58 days.

(21) Appl. No.: 11/479,296

(22) Filed: Jun. 30, 2006

(65) Prior Publication Data
US 2007/0003259 A1    Jan. 4, 2007

(30) Foreign Application Priority Data
Jul. 4, 2005    (JP) ............................ 2005-195118

(51) Int. Cl.
*G01N 21/86* (2006.01)
*G01N 21/88* (2006.01)
*G01V 8/00* (2006.01)

(52) U.S. Cl. ............. 250/559.2; 250/559.1; 250/559.4; 356/448

(58) Field of Classification Search .............. 250/559.1, 250/559.2, 559.39, 559.4; 219/405, 411, 219/209, 220, 251, 258, 264, 399, 441, 446.1; 356/432, 448
See application file for complete search history.

(56) References Cited

U.S. PATENT DOCUMENTS
2005/0018196 A1*    1/2005    Kusuda ...................... 356/448

FOREIGN PATENT DOCUMENTS
JP            2005-39213        2/2005

* cited by examiner

*Primary Examiner*—Georgia Y. Epps
*Assistant Examiner*—Francis M Legasse, Jr.
(74) *Attorney, Agent, or Firm*—Ostrolenk, Faber, Gerb & Soffen, LLP

(57) ABSTRACT

A measuring optical system for emitting and receiving light is fixedly installed in a ceiling portion of a measuring device, and a wafer holding part for supporting a semiconductor wafer is provided in a bottom portion of the measuring device. A support table is horizontally laid between support pins of the wafer holding part, and a calibration standard member for calibration is placed on an upper surface of the support table. When a semiconductor wafer is supported by the support pins, light emerging from the measuring optical system impinges upon the semiconductor wafer, and the reflection intensity of the light is measured. When no semiconductor wafer is supported by the support pins, light emerging from the measuring optical system impinges upon the calibration standard member, whereby the calibration can be done at any time.

8 Claims, 11 Drawing Sheets

REFLECTED LIGHT INTENSITY RATIO MEASURING DEVICE, DEVICE FOR MEASURING LIGHT ENERGY ABSORPTION RATIO AND HEAT TREATMENT APPARATUS

BACKGROUND OF THE INVENTION

1. Field of the Invention

The present invention relates to a reflected light intensity ratio measuring device for measuring a reflected light intensity ratio of a substrate to be treated to a standard substrate, a measuring device for measuring a light energy absorption ratio of the substrate to be treated to the standard substrate, and a heat treatment apparatus incorporating the measuring device.

2. Description of the Background Art

Conventionally, a lamp annealer employing a halogen lamp has been typically used in the step of activating ions in a semiconductor wafer after ion implantation. Such a lamp annealer carries out the activation of ions in the semiconductor wafer by heating (or annealing) the semiconductor wafer to a temperature of, for example, about 1000° C. to about 1100° C. Such a heat treatment apparatus utilizes the energy of light emitted from the halogen lamp to raise the temperature of a substrate at a rate of about hundreds of degrees per second.

In recent years, with the increasing degree of integration of semiconductor devices, it has been desired to provide a shallower junction as the gate length decreases. It has turned out, however, that even the execution of the process of activating ions in a semiconductor wafer by the use of the above-mentioned lamp annealer which raises the temperature of the semiconductor wafer at a rate of about hundreds of degrees per second produces a phenomenon in which the ions of boron, phosphorus and the like implanted in the semiconductor wafer are diffused deeply by heat. The occurrence of such a phenomenon causes the depth of the junction to exceed a required level, giving rise to an apprehension about a hindrance to good device formation.

To solve the problem, there has been proposed a technique for exposing the surface of a semiconductor wafer to a flash of light by using a xenon flash lamp and the like to raise the temperature of only the surface of the semiconductor wafer implanted with ions in an extremely short time (several milliseconds or less). The xenon flash lamp has a spectral distribution of radiation ranging from ultraviolet to near-infrared regions. The wavelength of light emitted from the xenon flash lamp is shorter than that of light emitted from the conventional halogen lamp, and approximately coincides with a basic absorption band of a silicon semiconductor wafer. It is therefore possible to rapidly raise the temperature of the semiconductor wafer, with a small amount of light transmitted through the semiconductor wafer, when the semiconductor wafer is exposed to a flash of light emitted from the xenon flash lamp. Also, it has turned out that a flash of light emitted in an extremely short time of several milliseconds or less can achieve a selective temperature rise only near the surface of the semiconductor wafer. Therefore, the temperature rise in an extremely short time by using the xenon flash lamp allows the execution of only the ion activation without deeply diffusing the ions.

A heat treatment apparatus employing such a xenon flash lamp, which exposes the wafer surface to light having ultra-high energy in an extremely short time, rapidly raises the temperature of the surface of the wafer, to cause the abrupt expansion of only the surface of the wafer. It has also turned out that, if the energy from the xenon flash lamp is excessive, the abrupt expansion of only the wafer surface results in the occurrence of slip on the wafer surface or the occurrence of a crack in the wafer in the worst case. On the other hand, the less light energy for the exposure fails to activate the ions. It is therefore important to optimize the range of the light energy emitted from the xenon flash lamp.

In general, when a flash lamp which emits light in an extremely short time is used, it is impossible to effect feedback control of a lamp output based on the measurement result of the temperature of the semiconductor wafer. For this reason, the following technique is used. A bare wafer which is not patterned is implanted with ions and is actually exposed to light. After the heat treatment, characteristics (e.g., sheet resistance and the like) of the wafer are measured. The light energy provided from the xenon flash lamp is adjusted based on the result of the measurement.

However, most wafers to be actually treated are patterned and are hence different in light absorbing characteristic from unpatterned bare wafers. When exposed to light of the same amount of energy, the patterned wafers tend to absorb more light energy than the bare wafers. For this reason, there has been a problem such that the wafers to be actually treated absorb more light energy to result in cracks in the wafers although the energy for exposure of the bare wafers is optimized. To prevent this, a correction for each wafer to be treated must be made to the proper value of the energy for exposure of the bare wafers.

To solve such a problem, Japanese Patent Application Laid-Open No. 2005-39213 discloses a technique to be described below. Prior to flash heating, this technique includes: measuring the reflection intensities of a standard wafer having a known reflectivity, an unpatterned wafer (e.g., a bare wafer) and a semiconductor wafer to be actually treated to calculate the value of light energy absorbed by the unpatterned wafer and the value of light energy absorbed by the wafer to be treated; calculating the light energy absorption ratio of the wafer to be treated to the unpatterned wafer based on the calculated light energy values; and calculating a proper value of energy to be applied to the wafer to be treated from the calculated light energy absorption ratio and a proper value of light energy to be applied to the unpatterned wafer.

In short, the technique disclosed in Japanese Patent Application Laid-Open No. 2005-39213 uses the reflection intensity of the unpatterned wafer as a reference value to calculate the proper value of energy to be applied to the wafer to be treated based on a result of relative comparison between the reference value and the reflection intensity of the wafer to be treated. A device for performing a computation based on such a relative comparison with the reference value involves the need to measure the reflection intensity of the unpatterned wafer at regular time intervals to store the measured result again and again (which is known as calibration), for example, in order to respond to factors of variations with time, such as aged deterioration, of a light source for reflection intensity measurement.

The calibration process, however, necessitates a stop of the actual operation (the process of the wafer to be treated) of the heat treatment apparatus to conduct a measurement of the reflection intensity of the unpatterned wafer. This, of course, lowers the rate of operation of the heat treatment apparatus by the amount of the stop time. Further, the management and storage of wafers for calibration have been burdensome because it is desirable to continue using the same wafers for calibration.

SUMMARY OF THE INVENTION

The present invention is intended for a reflected light intensity ratio measuring device for measuring a reflected light intensity ratio of an object substrate to be treated to a standard substrate.

According to the present invention, the reflected light intensity ratio measuring device comprises: a chamber for receiving the object substrate therein; a substrate holding part for holding the object substrate within the chamber; a light emitting and receiving part fixed to the chamber for directing light onto a main surface of the object substrate held by the substrate holding part and for receiving light reflected from the main surface; a calibration standard member placed in an optical path of light emerging from the light emitting and receiving part, the calibration standard member being similar in surface property to the standard substrate; and a calculation part for calculating the reflected light intensity ratio of the object substrate to the standard substrate from the intensity of reflected light obtained when light is directed from the light emitting and receiving part onto the calibration standard member and the intensity of reflected light obtained when light is directed onto the object substrate, the calibration standard member being placed in such a position that the light emerging from the light emitting and receiving part impinges upon the object substrate when the object substrate is held by the substrate holding part and impinges upon the calibration standard member when no object substrate is held by the substrate holding part.

The calibration using the calibration standard member can be done whenever there is no object substrate held by the substrate holding part. The calibration process can be performed easily without stopping the actual operation of the device.

Preferably, the substrate holding part includes a plurality of support pins for supporting the object substrate from below, and a support table horizontally laid between the plurality of support pins. The light emitting and receiving part is provided in a position directly over the substrate holding part in a ceiling portion of the chamber. The calibration standard member is placed on an upper surface of the support table.

The calibration using the calibration standard member can be done whenever there is no object substrate placed on the support pins.

The present invention is also intended for a measuring device for measuring a light energy absorption ratio of an object substrate to be treated to a standard substrate.

The present invention is further intended for a heat treatment apparatus for exposing an object substrate to light to heat the object substrate.

It is therefore an object of the present invention to provide a reflected light intensity ratio measuring device, a measuring device for measuring a light energy absorption ratio, and a heat treatment apparatus which are capable of performing a calibration process easily without stopping the actual operation of the heat treatment apparatus.

These and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiment according to the present invention will now be described in detail with reference to the drawings.

<1. Overall Construction of Heat Treatment Apparatus>

Figure 1:
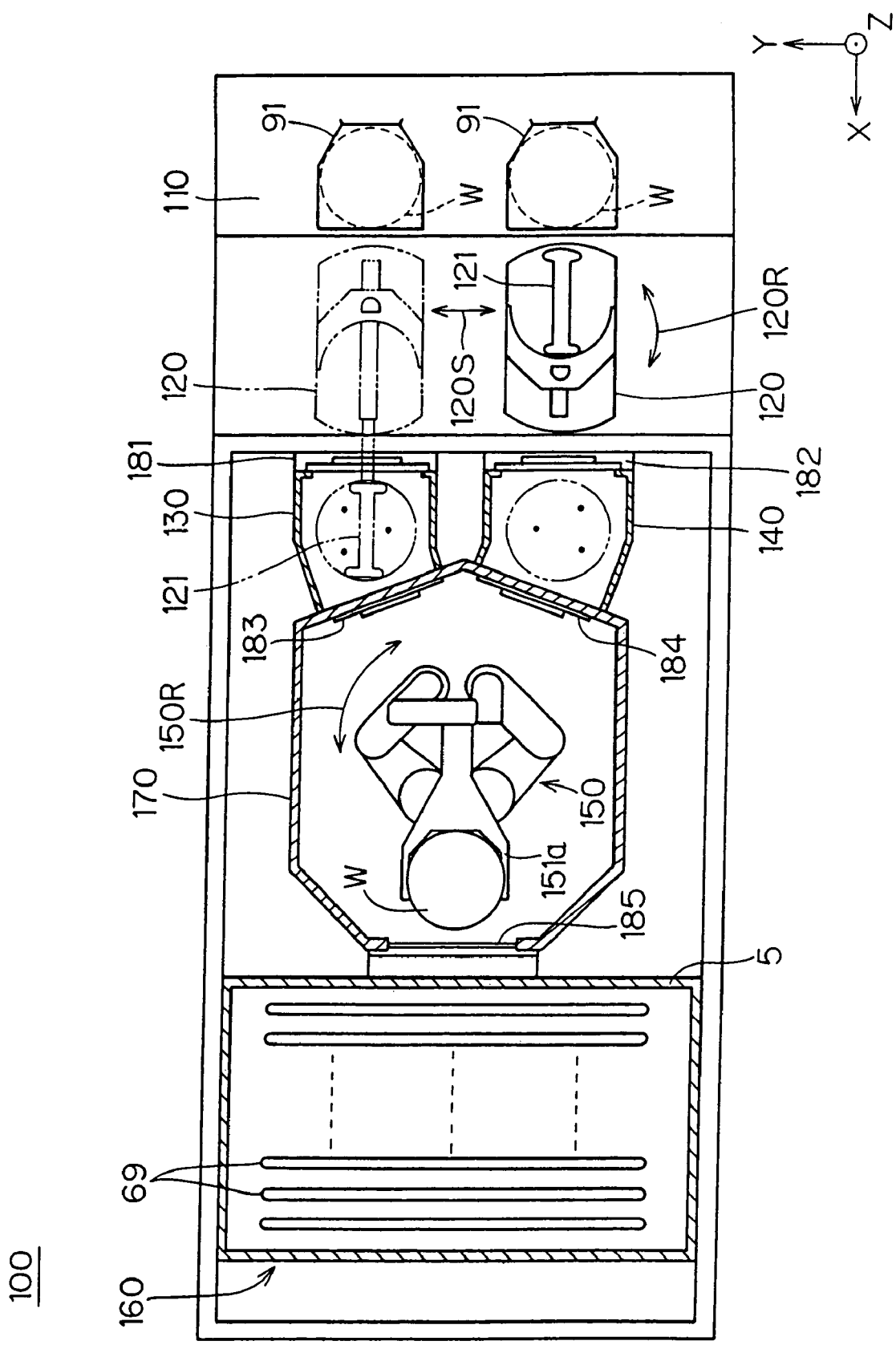
FIG. 1 is a plan view showing a heat treatment apparatus according to the present invention.
Figure 2:
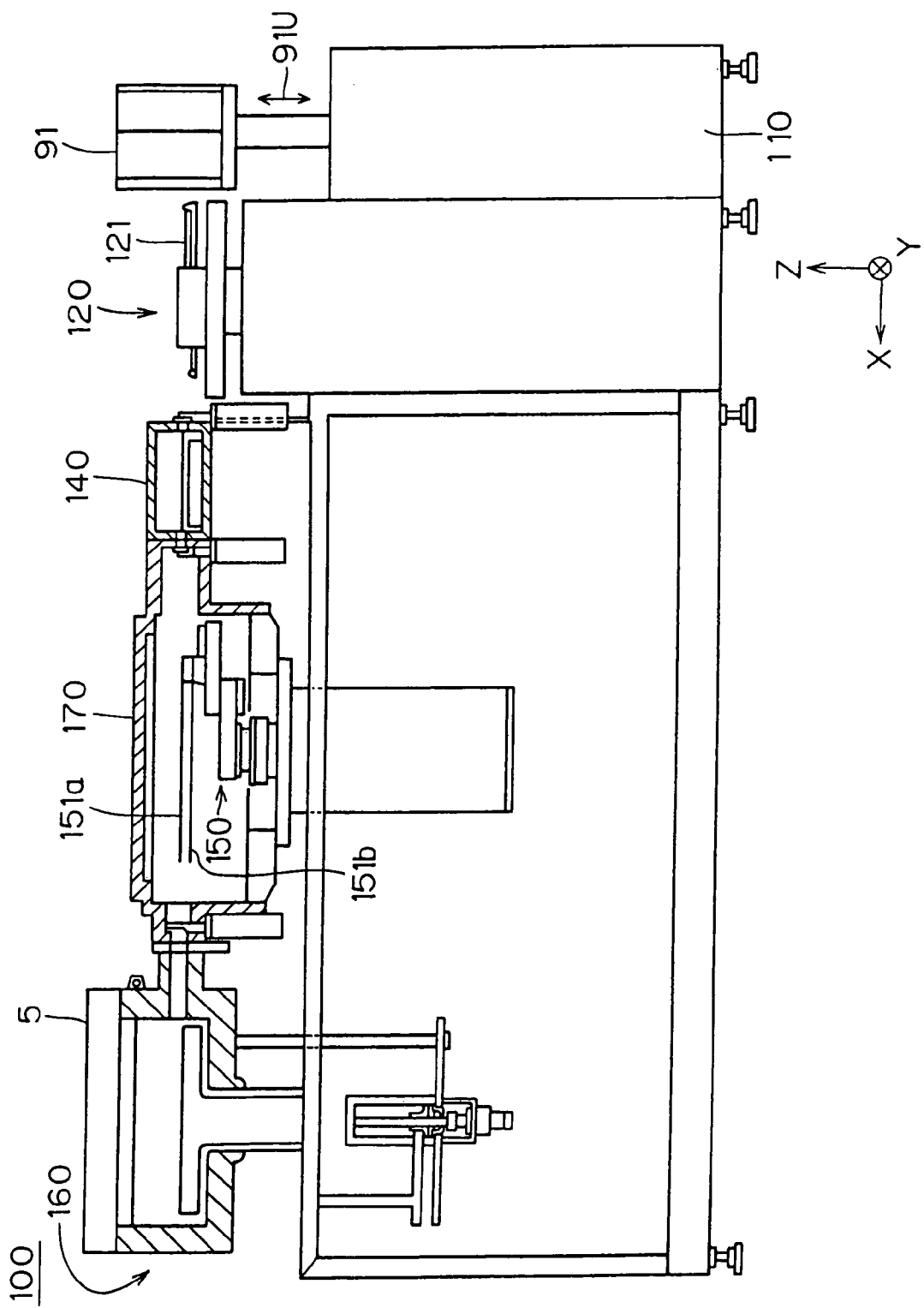
FIG. 2 is a front view of the heat treatment apparatus of FIG. 1.

FIG. 1 is a plan view showing a heat treatment apparatus 100 according to the present invention, and FIG. 2 is a front view thereof. In FIGS. 1 and 2, portions of the heat treatment apparatus 100 are shown in section as appropriate, and detailed portions thereof are simplified as appropriate. For the sake of definiteness of directions relative to each other, an XYZ rectangular coordinate system which defines the direction of the Z axis as the vertical direction and the X-Y plane as the horizontal plane is additionally shown, as appropriate, in FIGS. 1 and 2 and the subsequent figures.

As shown in FIGS. 1 and 2, the heat treatment apparatus 100 includes: an indexer part 110 for transporting an untreated semiconductor wafer W into the heat treatment apparatus 100 and for transporting a treated semiconductor wafer W out of the heat treatment apparatus 100; a transfer robot 120 for transferring a semiconductor wafer W into and out of the indexer part 110; an alignment part 130 for positioning an untreated semiconductor wafer W; a cooling part (or cooler) 140 for cooling a treated semiconductor wafer W; a transport robot 150 for transporting a semiconductor wafer W into and out of the alignment part 130, the cooling part 140 and the like; and a heating treatment part 160 for performing flash heating treatment on a semiconductor wafer W.

There is provided a transport chamber 170 accommodating the transport robot 150 and serving as a space in which the transport robot 150 transports a semiconductor wafer W. The alignment part 130, the cooling part 140 and the heating treatment part 160 are placed so as to be coupled to the transport chamber 170.

The indexer part 110 is a section onto which two cassettes (or carriers) 91 are transported and placed by an automatic guided vehicle (AGV) and the like. While being held in one of the cassettes 91, a semiconductor wafer W is transported into and out of the heat treatment apparatus 100. In the indexer part 110, each of the cassettes 91 is configured to move upwardly and downwardly as indicated by the arrow 91U of FIG. 2 so that the transfer robot 120 can transfer any semiconductor wafer W into and out of each of the cassettes 91.

The transfer robot 120 is capable of sliding as indicated by the arrow 120S, pivoting as indicated by the arrow 120R and slightly moving upwardly and downwardly. This allows the transfer robot 120 to transfer a semiconductor wafer W into and out of the two cassettes 91, and to transfer and receive a semiconductor wafer W to and from the alignment part 130 and the cooling part 140.

The transfer of a semiconductor wafer W into and out of the cassettes 91 by the transfer robot 120 is accomplished by the sliding movement of a hand 121 and the upward and downward movements of the cassettes 91. The transfer of a semiconductor wafer W between the transfer robot 120 and the alignment part 130 or the cooling part 140 is accomplished by the sliding movement of the hand 121 and the upward and downward movements of the transfer robot 120.

The semiconductor wafer W is transferred from the transfer robot 120 to the alignment part 130, with the center of the semiconductor wafer W placed in a predetermined position. The alignment part 130 rotates the semiconductor wafer W to a suitable orientation. The alignment part 130 includes an optical measurement unit to be described later, and measures the light energy absorption ratio and the like of a semiconductor wafer W to be heat-treated by means of the optical measurement unit. The construction of the alignment part 130 will be described later.

The transport robot 150 is pivotable about a vertical axis, as indicated by the arrow 150R. The transport robot 150 has two linkage mechanisms composed of a plurality of arm segments. Transport arms 151a and 151b each for holding a semiconductor wafer W are provided on the distal ends of the two linkage mechanisms, respectively. The transport arms 151a and 151b are vertically spaced a predetermined distance apart from each other, and are linearly slidable in the same horizontal direction independently by the two linkage mechanisms. The transport robot 150 moves a base for the two linkage mechanism upwardly and downwardly, thereby to move the two transport arms 151a and 151b upwardly and downwardly with the predetermined distance maintained therebetween.

The transport robot 150 transfers a semiconductor wafer W to and from (into and out of) the alignment part 130, the heating treatment part 160 or the cooling part 140 serving as a transfer partner in a manner to be described below. First, the transport arms 151a and 151b pivot so as to be opposed to the transfer partner. After pivoting (or while pivoting), the transport arms 151a and 151b move upwardly and downwardly so that one of the transport arms 151a and 151b is in a vertical position where the one of the transport arms 151a and 151b transfers the semiconductor wafer W to or from the transfer partner. The transport arm 151a (or 151b) is slid linearly in a horizontal direction for the transfer of the semiconductor wafer W.

The heating treatment part 160 is a section for exposing a semiconductor wafer W to a flash of light emitted from xenon flash lamps 69 (also referred to simply as "flash lamps 69") to perform heating treatment on the semiconductor wafer W.

Because of the high temperature of the semiconductor wafer W immediately after being subjected to the treatment in the heating treatment part 160, the semiconductor wafer W is placed into the cooling part 140 by the transport robot 150 and is cooled therein. The semiconductor wafer W cooled down in the cooling part 140 is returned as a treated semiconductor wafer W back to one of the cassettes 91 by the transfer robot 120.

In the heat treatment apparatus 100, the transport robot 150 is surrounded by the transport chamber 170 which in turn is connected to the alignment part 130, the cooling part 140 and the heating treatment part 160, as discussed above. Gave valves 181 and 182 are provided between the transfer robot 120 and the alignment part 130 and between the transfer robot 120 and the cooling part 140, respectively. Gate valves 183, 184 and 185 are provided between the transport chamber 170 and the alignment part 130, between the transport chamber 170 and the cooling part 140, and between the transport chamber 170 and the heating treatment part 160, respectively. A nitrogen gas of high purity is supplied from a nitrogen gas supply part (not shown) to the alignment part 130, the cooling part 140 and the transport chamber 170 so as to maintain the cleanliness of the interiors of the alignment part 130, the cooling part 140 and the transport chamber 170. The surplus of nitrogen gas is exhausted through an exhaust pipe as appropriate. These gate valves 181 to 185 are opened and closed as appropriate during the transport of the semiconductor wafer W.

The alignment part 130 and the cooling part 140 are in different positions between the transfer robot 120 and the transport robot 150. A semiconductor wafer W prior to heat treatment is temporarily placed in the alignment part 130 for the positioning of the semiconductor wafer W. A semiconductor wafer W after the heat treatment is temporarily placed in the cooling part 140 for the cooling of the semiconductor wafer W.

<2. Construction of Heating Treatment Part>

Figure 3:
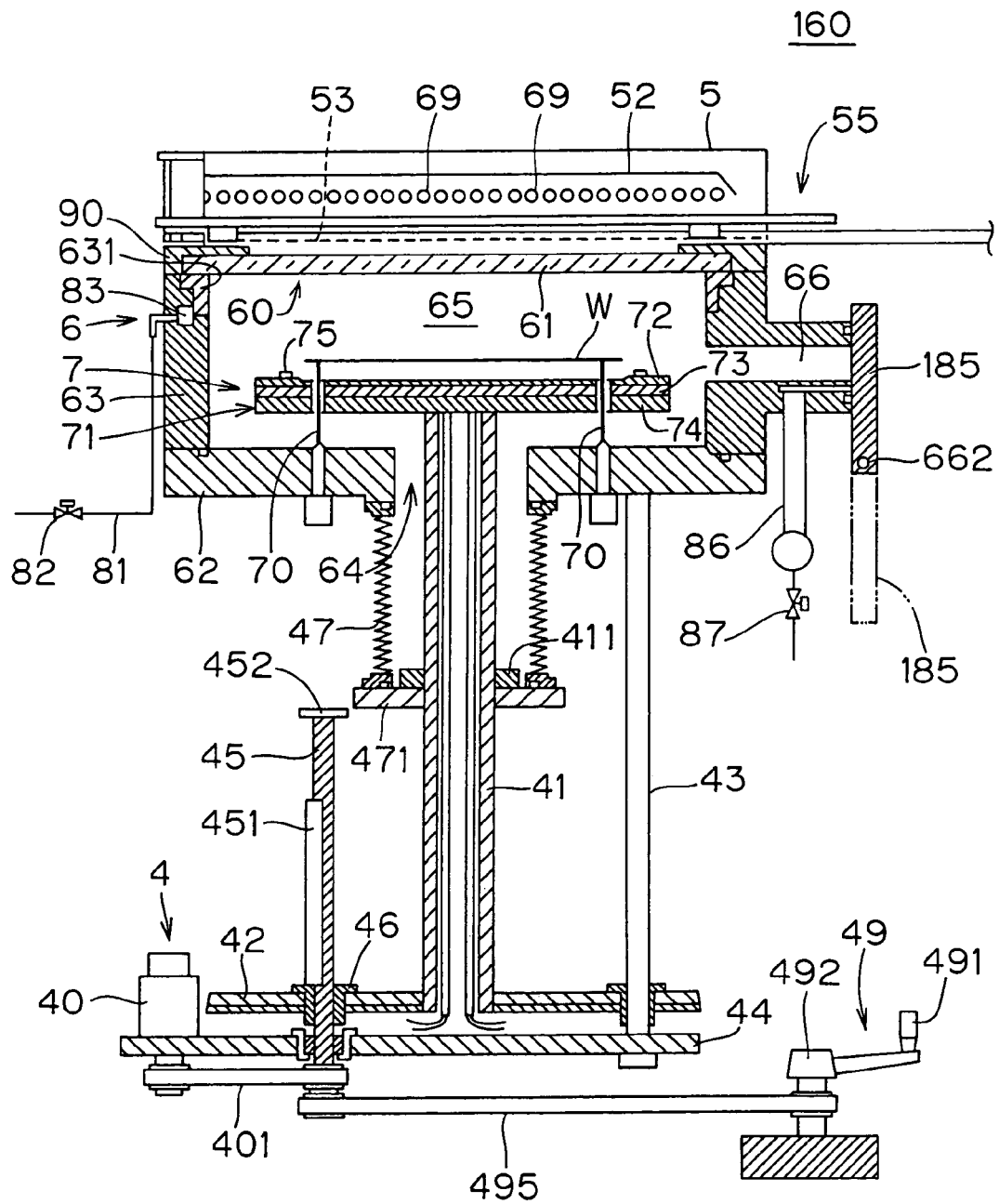
FIG. 3 is a side sectional view showing the construction of a heating treatment part in the heat treatment apparatus of FIG. 1.

Next, the construction of the heating treatment part 160 will be described. FIG. 3 is a side sectional view showing the construction of the heating treatment part 160. The heating treatment part 160 is a heat treatment unit for exposing a semiconductor wafer W serving as a substrate to a flash of light to heat the semiconductor wafer W.

The heating treatment part 160 comprises a chamber 6 of a generally cylindrical configuration for receiving a semiconductor wafer W therein. The chamber 6 includes a chamber side portion 63 having an inner wall of a generally cylindrical configuration, and a chamber bottom portion 62 for covering a bottom portion of the chamber side portion 63. A space surrounded by the chamber side portion 63 and the chamber bottom portion 62 is defined as a heat treatment space 65. A top opening 60 is formed over the heat treatment space 65.

The heating treatment part 160 further comprises: a light-transmittable plate 61 serving as a closure member mounted in the top opening 60 for closing the top opening 60; a holding part 7 of a generally disk-shaped configuration for preheating a semiconductor wafer W while holding the semiconductor wafer W within the chamber 6; a holding part elevating mechanism 4 for moving the holding part 7 upwardly and downwardly relative to the chamber bottom portion 62 serving as the bottom surface of the chamber 6; and a light emitting part 5 for directing light through the light-transmittable plate 61 onto the semiconductor wafer W held by the holding part 7 to heat the semiconductor wafer W. A controller 3 for the heat treatment apparatus 100 controls the above-mentioned components.

The chamber 6 is provided under the light emitting part 5. The light-transmittable plate 61 provided in an upper portion of the chamber 6 is a disk-shaped member made of, for example, quartz, and functions as a chamber window for allowing light emitted from the light emitting part 5 to travel therethrough into the heat treatment space 65. The chamber bottom portion 62 and the chamber side portion 63 which constitute the main body of the chamber 6 are made of a metal material having high strength and high heat resistance such as stainless steel and the like. A ring 631 provided in an upper portion of the inner side surface of the chamber side portion 63 is made of an aluminum (Al) alloy and the like having greater durability against degradation resulting from exposure to light than stainless steel.

An O-ring provides a seal between the light-transmittable plate 61 and the chamber side portion 63 so as to maintain the hermeticity of the heat treatment space 65. Specifically, the O-ring is fitted between a lower peripheral portion of the light-transmittable plate 61 and the chamber side portion 63, and a clamp ring 90 abuts against an upper peripheral portion of the light-transmittable plate 61 and is secured to the chamber side portion 63 by screws, thereby forcing the light-transmittable plate 61 against the O-ring.

The chamber bottom portion 62 is provided with a plurality of (in this preferred embodiment, three) upright support pins 70 extending through the holding part 7 for supporting the lower surface (a surface opposite from a surface onto which light is directed from the light emitting part 5) of the semiconductor wafer W. The support pins 70 are made of, for example, quartz, and are easy to replace because the support pins 70 are fixed externally of the chamber 6.

The chamber side portion 63 includes a transport opening 66 for the transport of the semiconductor wafer W therethrough into and out of the chamber 6. The transport opening 66 is openable and closable by the gate valve 185 pivoting about an axis 662. An inlet passage 81 for introducing a processing gas (for example, an inert gas including nitrogen ($N_2$) gas, helium (He) gas, argon (Ar) gas and the like, or oxygen ($O_2$) gas and the like) into the heat treatment space 65 is formed on the opposite side of the chamber side portion 63 from the transport opening 66. The inlet passage 81 has a first end connected through a valve 82 to a gas supply mechanism not shown, and a second end connected to a gas inlet buffer 83 formed inside the chamber side portion 63. The transport opening 66 is provided with an outlet passage 86 for exhausting the gas from the interior of the heat treatment space 65. The outlet passage 86 is connected through a valve 87 to an exhaust mechanism not shown.

Figure 4:
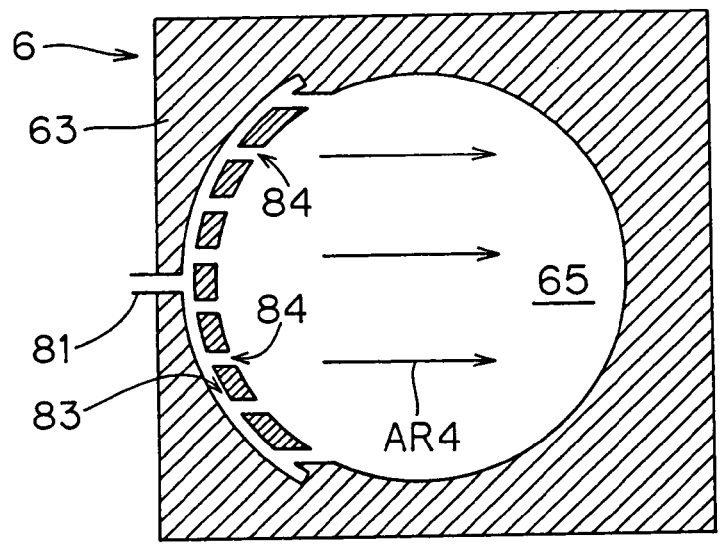
FIG. 4 is a sectional view of a chamber in the heating treatment part of FIG. 3 taken along a horizontal plane at the level of a gas inlet buffer.

FIG. 4 is a sectional view of the chamber 6 taken along a horizontal plane at the level of the gas inlet buffer 83. As shown in FIG. 4, the gas inlet buffer 83 extends over approximately one-third of the inner periphery of the chamber side portion 63 on the opposite side from the transport opening 66 shown in FIG. 3. The processing gas introduced through the inlet passage 81 to the gas inlet buffer 83 is fed through a plurality of gas feed holes 84 into the heat treatment space 65.

The holding part elevating mechanism 4 shown in FIG. 3 includes a shaft 41 of a generally cylindrical configuration, a movable plate 42, guide members 43 (three guide members 43 are actually provided around the shaft 41 in this preferred embodiment), a fixed plate 44, a ball screw 45, a nut 46, and a motor 40. The chamber bottom portion 62 serving as the bottom portion of the chamber 6 is formed with a bottom opening 64 of a generally circular configuration having a diameter smaller than that of the holding part 7. The shaft 41 made of stainless steel is inserted through the bottom opening 64 and connected to the lower surface of the holding part 7 (a hot plate 71 of the holding part 7 in a strict sense) to support the holding part 7.

The nut 46 for threaded engagement with the ball screw 45 is fixed to the movable plate 42. The movable plate 42 is slidably guided by the guide members 43 fixed to the chamber bottom portion 62 and extending downwardly therefrom, and is vertically movable. The movable plate 42 is coupled through the shaft 41 to the holding part 7.

The motor 40 is provided on the fixed plate 44 mounted to the lower end portions of the respective guide members 43, and is connected to the ball screw 45 through a timing belt 401. When the holding part elevating mechanism 4 moves the holding part 7 upwardly and downwardly, the motor 40 serving as a driver rotates the ball screw 45 under the control of the controller 3 to move the movable plate 42 fixed to the nut 46 vertically along the guide members 43. As a result, the shaft 41 fixed to the movable plate 42 moves vertically, whereby the holding part 7 connected to the shaft 41 smoothly moves upwardly and downwardly between a transfer position shown in FIG. 3 in which the semiconductor wafer W is transferred and a heat treatment position shown in FIG. 6 in which the semiconductor wafer W is heat-treated.

An upright mechanical stopper 451 of a generally semi-cylindrical configuration (obtained by cutting a cylinder in half in a longitudinal direction) is provided on the upper surface of the movable plate 42 so as to extend along the ball screw 45. If the movable plate 42 is to move upwardly beyond a predetermined upper limit because of any anomaly, the upper end of the mechanical stopper 451 strikes an end plate 452 provided at an end portion of the ball screw 45, whereby the abnormal upward movement of the movable plate 42 is prevented. This avoids the upward movement of the holding part 7 above a predetermined position lying under the light-transmittable plate 61, to thereby prevent a collision between the holding part 7 and the light-transmittable plate 61.

The holding part elevating mechanism 4 further includes a manual elevating part 49 for manually moving the holding part 7 upwardly and downwardly during the maintenance of the interior of the chamber 6. The manual elevating part 49 has a handle 491 and a rotary shaft 492. Rotating the rotary shaft 492 by means of the handle 491 causes the rotation of the ball screw 45 connected through a timing belt 495 to the rotary shaft 492, thereby moving the holding part 7 upwardly and downwardly.

An expandable/contractible bellows 47 surrounding the shaft 41 and extending downwardly from the chamber bottom portion 62 is provided under the chamber bottom portion 62, and has an upper end connected to the lower surface of the chamber bottom portion 62. The bellows 47 has a lower end mounted to a bellows lower end plate 471. The bellows lower end plate 471 is screw-held and mounted to the shaft 41 by a collar member 411. The bellows 47 contracts when the holding part elevating mechanism 4 moves the holding part 7 upwardly relative to the chamber bottom portion 62, and expands when the holding part elevating mechanism 4 moves the holding part 7 downwardly. When the holding part 7 moves upwardly and downwardly, the bellows 47 contracts and expands to maintain the heat treatment space 65 hermetically sealed.

The holding part 7 includes the hot plate (or heating plate) 71 for preheating (or assist-heating) the semiconductor wafer W, and a susceptor 72 provided on the upper surface (a surface on which the holding part 7 holds the semiconductor wafer W) of the hot plate 71. The shaft 41 for moving the holding part 7 upwardly and downwardly as mentioned above is connected to the lower surface of the holding part 7. The susceptor 72 is made of quartz (or may be made of aluminum nitride (AlN) or the like). Pins 75 for preventing the semiconductor wafer W from shifting out of place are mounted on the upper surface of the susceptor 72. The susceptor 72 is provided on the hot plate 71, with the lower surface of the susceptor 72 in face-to-face contact with the upper surface of the hot plate 71. Thus, the susceptor 72 diffuses heat energy from the hot plate 71 to transfer the heat energy to the semiconductor wafer W placed on the upper surface of the susceptor 72, and is removable from the hot plate 71 for cleaning during maintenance.

The hot plate 71 includes an upper plate 73 and a lower plate 74 both made of stainless steel. Resistance heating wires such as nichrome wires for heating the hot plate 71 are provided between the upper plate 73 and the lower plate 74, and an electrically conductive brazing metal containing nickel (Ni) fills the space between the upper plate 73 and the lower plate 74 to seal the resistance heating wires therewith. The upper plate 73 and the lower plate 74 have brazed or soldered ends.

Figure 5:
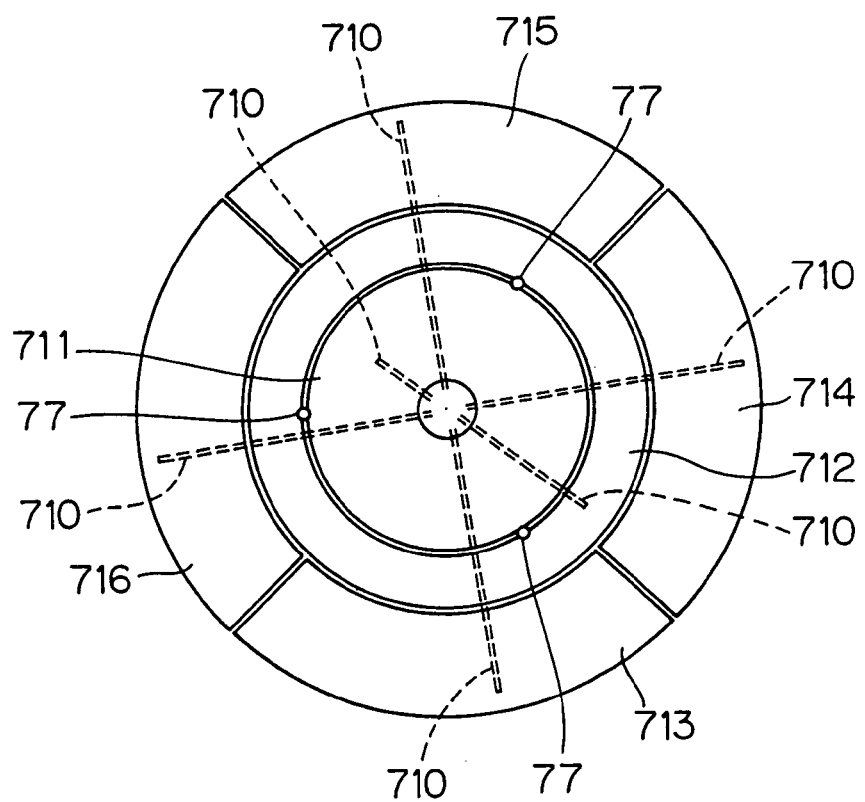
FIG. 5 is a plan view showing a hot plate in the heating treatment part of FIG. 3.

FIG. 5 is a plan view of the hot plate 71. As shown in FIG. 5, the hot plate 71 has a circular zone 711 and an annular zone 712 arranged in concentric relation with each other and positioned in a central portion of a region opposed to the semiconductor wafer W held by the holding part 7, and four zones 713 to 716 into which a substantially annular region surrounding the zone 712 is circumferentially equally divided. Slight gaps are formed between these zones 711 to 716. The hot plate 71 is provided with three through holes 77 receiving the respective support pins 70 therethrough and circumferentially spaced 120° apart from each other in a gap between the zones 711 and 712.

In the six zones 711 to 716, the resistance heating wires independent of each other are disposed so as to make a circuit to form heaters, respectively. The heaters incorporated in the respective zones 711 to 716 individually heat the respective zones 711 to 716. The semiconductor wafer W held by the holding part 7 is heated by the heaters incorporated in the six zones 711 to 716. A sensor 710 for measuring the temperature of each zone by using a thermocouple is provided in each of the zones 711 to 716. The sensors 710 pass through the interior of the generally cylindrical shaft 41 and are connected to the controller 3.

For heating the hot plate 71, the controller 3 controls the amount of power supply to the resistance heating wires provided in the respective zones 711 to 716 so that the temperatures of the six zones 711 to 716 measured by the sensors 710 reach a previously set predetermined temperature. The temperature control in each zone by the controller 3 is PID (Proportional, Integral, Derivative) control. In the hot plate 71, the temperatures of the respective zones 711 to 716 are continually measured until the heat treatment of the semiconductor wafer W (the heat treatment of all semiconductor wafers W when the plurality of semiconductor wafers W are successively heat-treated) is completed, and the amounts of power supply to the resistance heating wires provided in the respective zones 711 to 716 are individually controlled, that is, the temperatures of the heaters incorporated in the respective zones 711 to 716 are individually controlled, whereby the temperatures of the respective zones 711 to 716 are maintained at the set temperature. The set temperature for the zones 711 to 716 may be changed by an individually set offset value from a reference temperature.

The resistance heating wires provided in the six zones 711 to 716 are connected through power lines passing through the interior of the shaft 41 to a power source (not shown). The power lines extending from the power source to the zones 711 to 716 are disposed inside a stainless tube filled with an insulator of magnesia (magnesium oxide) or the like so as to be electrically insulated from each other. The interior of the shaft 41 is open to the atmosphere.

The light emitting part 5 shown in FIG. 3 is a light source including the plurality of (in this preferred embodiment, 30) xenon flash lamps (referred to simply as "flash lamps" hereinafter) 69, and a reflector 52. The plurality of flash lamps 69 each of which is a rodlike lamp having an elongated cylindrical configuration are arranged in a plane so that the longitudinal directions of the respective flash lamps 69 are in parallel with each other along a major surface of the semiconductor wafer W held by the holding part 7. The reflector 52 is provided over the plurality of flash lamps 69 to cover all of the flash lamps 69. The surface of the reflector 52 is roughened by abrasive blasting to produce a stain finish thereon. A light diffusion plate 53 (or a diffuser) is made of quartz glass having a surface subjected to a light diffusion process, and is provided on the lower surface side of the light emitting part 5, with a predetermined spacing held between the light diffusion plate 53 and the light-transmittable plate 61. The heating treatment part 160 further comprises an emitting part movement mechanism 55 for moving the light emitting part 5 upwardly relative to the chamber 6 and then for sliding the light emitting part 5 in a horizontal direction during maintenance.

Each of the xenon flash lamps 69 includes a glass tube containing xenon gas sealed therein and having positive and negative electrodes provided on opposite ends thereof and connected to a capacitor, and a trigger electrode wound on the outer peripheral surface of the glass tube. Because the xenon gas is electrically insulative, no current flows in the glass tube in a normal state. However, if a high voltage is applied to the trigger electrode to produce an electrical breakdown, electricity stored in the capacitor flows momentarily in the glass tube, and the Joule heat evolved at this time heats the xenon gas to cause light emission. The xenon flash lamps 69 have the property of being capable of emitting much intenser light than a light source that stays lit continuously because previously stored electrostatic energy is converted into an ultrashort light pulse ranging from 0.1 millisecond to 10 milliseconds.

The heating treatment part 160 according to this preferred embodiment includes various cooling structures (not shown) to prevent an excessive temperature rise in the chamber 6 and the light emitting part 5 because of the heat energy generated from the flash lamps 69 and the hot plate 71 during the heat treatment of the semiconductor wafer W. As an example, the chamber side portion 63 and the chamber bottom portion 62 of the chamber 6 are provided with a water cooling tube, and the light emitting part 5 is provided with a supply pipe for supplying a gas to the interior thereof and an exhaust pipe with a silencer to form an air cooling structure. Compressed air is supplied to the gap between the light-transmittable plate 61 and (the light diffusion plate 53 of) the light emitting part 5 to cool down the light emitting part 5 and the light-transmittable plate 61 and to remove organic materials and the like present in the gap therefrom to suppress the deposition of the organic materials and the like to the light diffusion plate 53 and the light-transmittable plate 61 during the heat treatment.

<3. Construction of Alignment Part>

Figure 7:
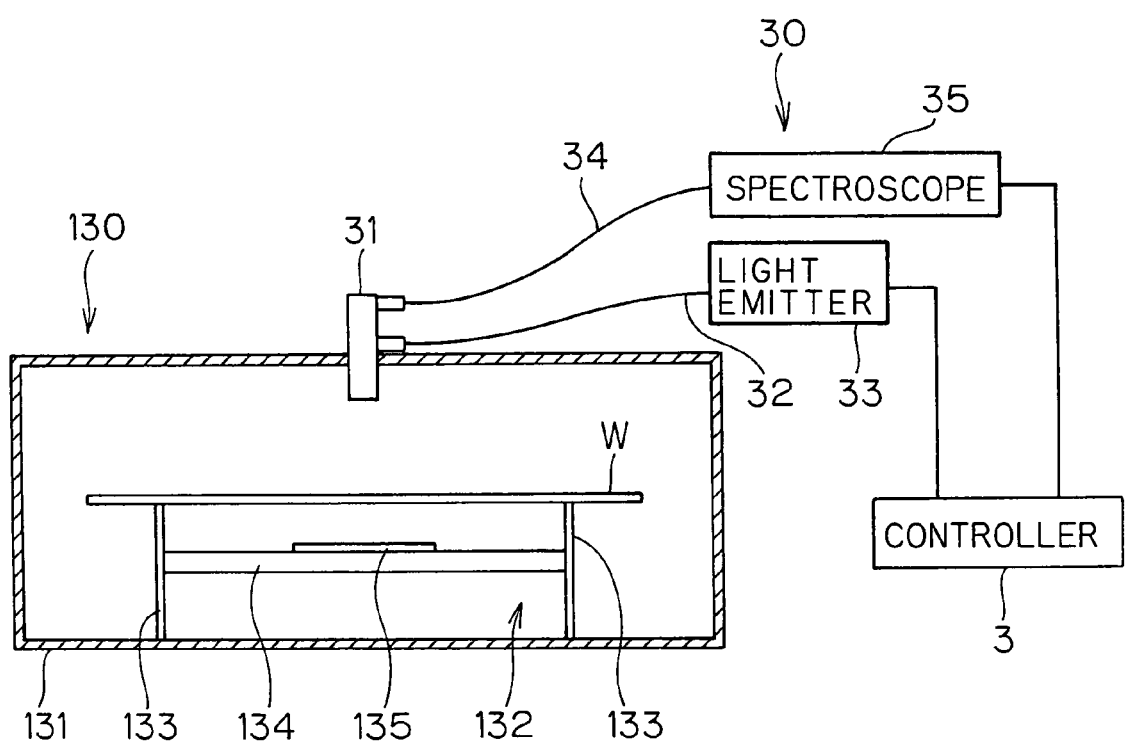
FIG. 7 shows the construction of an alignment part in the heat treatment apparatus of FIG. 1.

Next, the construction of the alignment part 130 will be described. FIG. 7 shows the construction of the alignment part 130. The alignment part 130 includes a chamber 131, a wafer holding part 132, and an optical measuring unit 30.

The chamber 131 is a housing made of metal for receiving a semiconductor wafer W therein. Side walls of the chamber 131 are provided with openings (not shown) through which the transfer robot 120 and the transport robot 150 access the interior of the chamber 131. These openings are opened and closed by the gate valves 181 and 183.

The wafer holding part 132 is provided in a bottom portion of the chamber 131. The wafer holding part 132 includes three support pins 133 and a support table 134. The three support pins 133 supports the lower surface of a semiconductor wafer W placed thereon. The three support pins 133 are cooperatively rotatable about a vertical axis by a rotary drive mechanism not shown. The support table 134 is horizontally laid between the three support pins 133. A calibration standard member 135 is centrally placed on the upper surface of the support table 134. In this preferred embodiment, an unpatterned bare wafer having a diameter of 75 mm (or a 3-inch wafer) is used as the calibration standard member 135, and is placed on the support table 134 so as to be parallel with the semiconductor wafer W supported by the support pins 133.

The optical measuring unit 30 includes a measuring optical system 31, a light emitter 33 coupled to the measuring optical system 31 through a light-emitting optical fiber 32, and a spectroscope 35 coupled to the measuring optical system 31 through a light-receiving optical fiber 34. Of the components of the optical measuring unit 30, the measuring optical system 31 is fixedly installed in a position directly over the wafer holding part 132 in a ceiling portion of the chamber 131, and the remaining components are provided outside the chamber 131. The light emitter 33 contains a lamp for generating a constant amount of light. The light emitted from the light emitter 33 is guided through the light-emitting optical fiber 32 to the measuring optical system 31.

Figure 8:
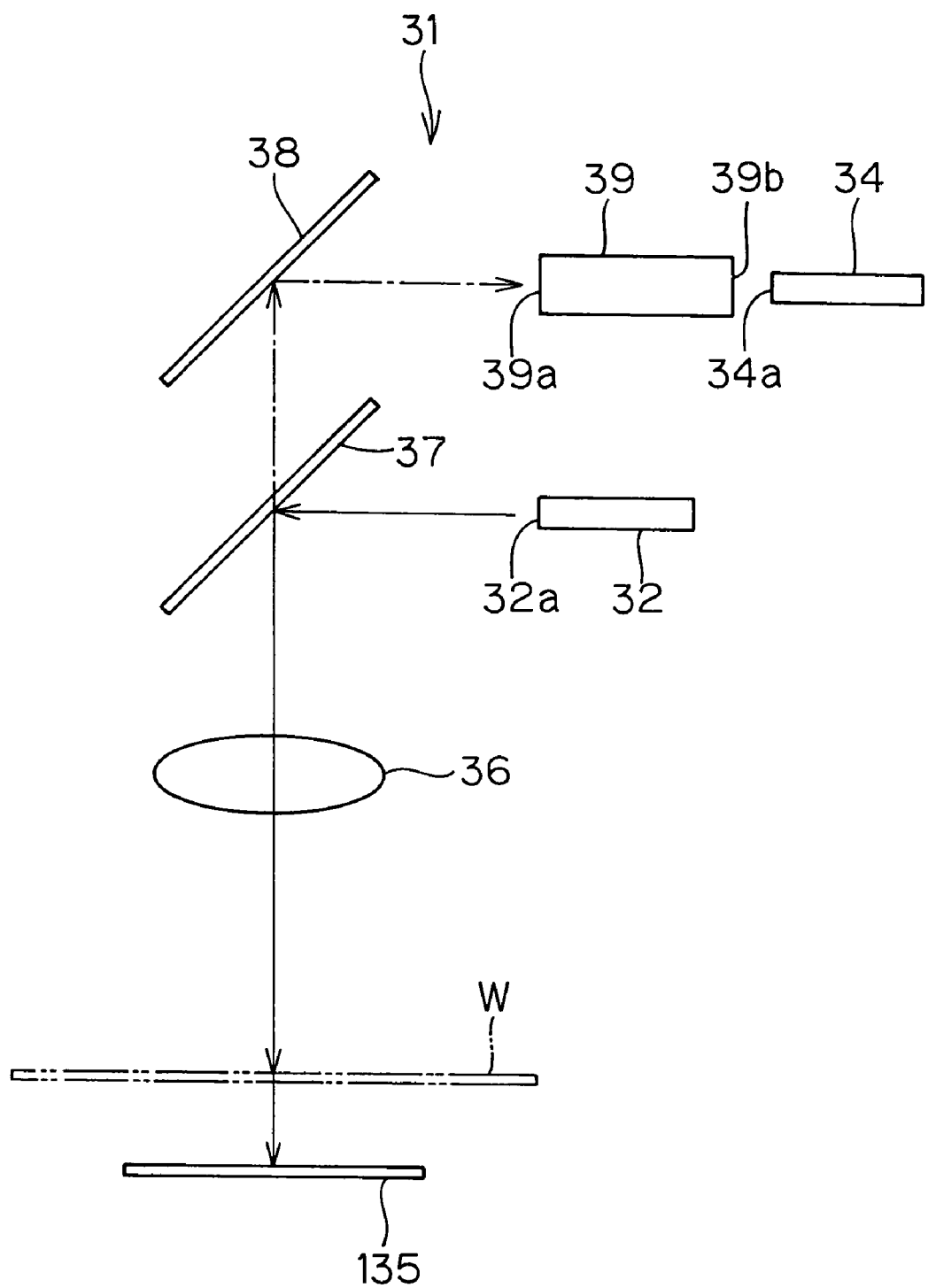
FIG. 8 illustrates the construction of a measuring optical system.

FIG. 8 illustrates the construction of the measuring optical system 31. The measuring optical system 31 functions as a light emitting and receiving part for directing light onto the main surface of a semiconductor wafer W held by the support pins 133 and for receiving the light reflected from the main surface. The measuring optical system 31 includes an achromatic lens 36, a half mirror 37 and a total reflection mirror 38 arranged vertically from bottom to top. A diffuser 39 is disposed in a position toward which the light reflected from the total reflection mirror 38 is directed.

The half mirror 37 assumes such a position as to form an angle of 45° with the semiconductor wafer W supported by the support pins 133 (or an angle of 45° with a horizontal plane). The half mirror 37 receives horizontal light from an exit end 32a of the light-emitting optical fiber 32, and reflects the light in a vertically downward direction. The light reflected from the half mirror 37 passes through the achromatic lens 36 and travels in a downward direction. Thus, the light emerging from the measuring optical system 31 in a downward direction impinges upon the main surface of a semiconductor wafer W when the semiconductor wafer W is supported by the support pins 133. When no semiconductor wafer W is supported by the support pins 133, on the other hand, the light emerging from the measuring optical system 31 impinges upon the upper surface of the calibration standard member 135.

That is, the calibration standard member 135 is placed in the optical path of the light emerging from the measuring optical system 31 by being placed on the support table 134 laid horizontally between the support pins 133. Providing the measuring optical system 31 in the ceiling portion of the chamber 131 and locating the calibration standard member 135 under the semiconductor wafer W supported by the support pins 133 cause the light emerging from the measuring optical system 31 to impinge upon the semiconductor wafer W when the semiconductor wafer W is supported by the support pins 133, and cause the light emerging from the measuring optical system 31 to impinge upon the calibration standard member 135 when no semiconductor wafer W is supported by the support pins 133. Because the light emerging from the measuring optical system 31 is collimated light, the calibration standard member 135 may be placed in any position which lies in the optical path of the light emerging from the measuring optical system 31 and lies under the semiconductor wafer W supported by the support pins 133. In consideration for slight manufacturing errors (e.g. parallelism of the calibration standard member 135 and the semiconductor wafer W), it is preferable to place the calibration standard member 135 as close to the semiconductor wafer W supported by the support pins 133 as possible for more accurate measurement.

The light reflected from the surface of the semiconductor wafer W or the calibration standard member 135 passes through the achromatic lens 36 and the half mirror 37 in sequence, and is then reflected from the total reflection mirror 38 toward the diff luser 39. The reflected light entering the diffuser 39 is subjected to the process of diff lusing light for uniformization, and is then enters an entrance end 34a of the light-receiving optical fiber 34.

Specifically, the diffuser 39 is provided between the entrance end 34a of the light-receiving optical fiber 34 and the total reflection mirror 38, and has an entrance face 39a opposed to the total reflection mirror 38 and an exit face 39b opposed to the entrance end 34a of the light-receiving optical fiber 34. The achromatic lens 36 has the function of focusing the light reflected from the semiconductor wafer W onto the entrance face 39a of the diffuser 39.

The light entering the light-receiving optical fiber 34 is subjected to the process of producing a spectrum by the spectroscope 35, and a resultant signal outputted from the spectroscope 35 is inputted to the controller 3. The controller 3 calculates a reflected light intensity ratio and a light energy absorption ratio of the semiconductor wafer W in a manner to be described later.

Figure 9:
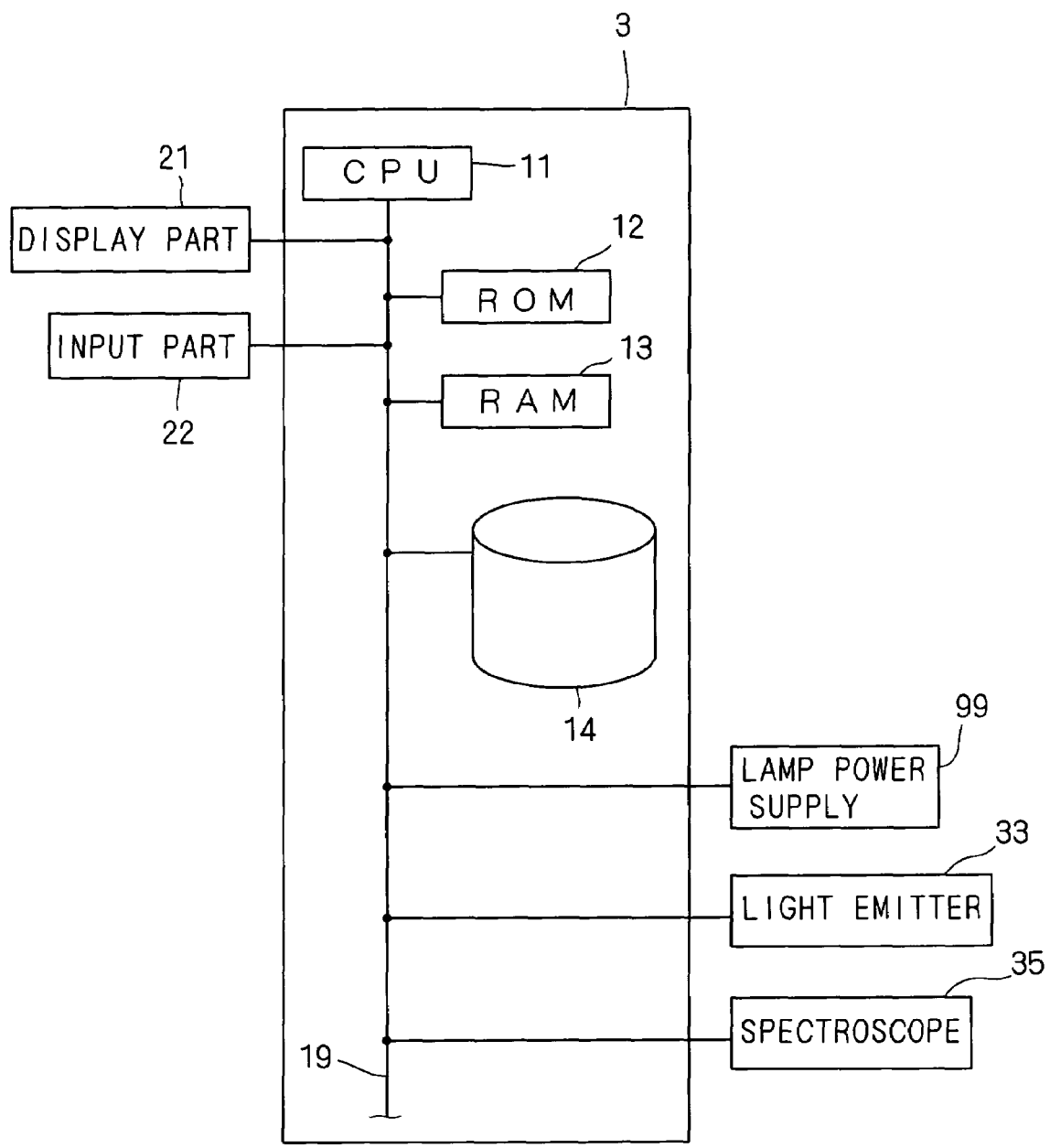
FIG. 9 is a block diagram showing the construction of a controller in the heat treatment apparatus of FIG. 1.

The controller 3 controls the heating treatment part 160 and the optical measuring unit 30 in the heat treatment apparatus 100, and also calculates the reflected light intensity ratio and the light energy absorption ratio of the semiconductor wafer W held in the alignment part 130 in a manner to be described later. FIG. 9 is a block diagram showing the construction of the controller 3. The controller 3 is similar in hardware construction to a typical computer. Specifically, the controller 3 includes a CPU 11 for performing various computation processes, a ROM 12 or read-only memory for storing a basic program therein, a RAM 13 or readable/writable memory for storing various pieces of information, a magnetic disk 14 for storing control software and data therein, and a bus line 19 connected to these components 11 to 14.

The bus line 19 is also electrically connected to a lamp power supply 99 for the heating treatment part 160, and to the light emitter 33 and the spectroscope 35 of the optical measuring unit 30. By executing the control software stored in the magnetic disk 14, the CPU 11 of the controller 3 measures the reflected light intensity ratio and the light energy absorption ratio of a wafer to be treated to a standard wafer, and also adjusts power to the flash lamps 69.

The bus line 19 is also electrically connected to a display part 21 and an input part 22. The display part 21 is constructed using, for example, a liquid crystal display, and displays various pieces of information such as processing results and recipe details. The input part 22 is constructed using, for example, a keyboard and a mouse, and accepts the entry of a command, a parameter and the like. An operator of the heat treatment apparatus 100 can enter a command, a parameter and the like through the input part 22 while viewing descriptions displayed on the display part 21. The display part 21 and the input part 22 may be integrated together into a touch panel device.

In addition to the components described above, the alignment part 130 includes a detection head (not shown) for detecting a cutaway portion of a semiconductor wafer W (a notch for a wafer having a diameter of 300 mm, and an orientation flat for a wafer having a diameter of 200 mm)

rotating while being supported by the support pins 133, a gas supply part (not shown) for supplying nitrogen gas into the chamber 131, an exhaust part (not shown) for exhausting an atmosphere gas from the chamber 131, and the like.

<4. Heat Treatment Operation in Heat Treatment Apparatus>

Next, the operation of heat-treating a semiconductor wafer W in the heat treatment apparatus 100 according to the present invention will be described. The semiconductor wafer W to be treated (referred to hereinafter as an "object semiconductor wafer W") in this heat treatment apparatus 100 is a semiconductor wafer subjected to ion implantation. A wafer flow in the entire heat treatment apparatus 100 will be described briefly, followed by the description of the measurement of the light energy absorption ratio of the semiconductor wafer W in the alignment part 130 and the details of treatment in the heating treatment part 160.

In the heat treatment apparatus 100, a cassette 91 with a plurality of ion-implanted semiconductor wafers W stored therein is placed on the indexer part 110. The transfer robot 120 takes the semiconductor wafers W one by one out of the cassette 91, and places each of the semiconductor wafers W in the alignment part 130. In the alignment part 130, the positioning of the semiconductor wafer W is done by optically detecting the notch and the like while the semiconductor wafer W supported by the support pins 133 is rotated about a vertical axis with the center of the semiconductor wafer W defined as the center of rotation. Additionally, the optical measuring unit 30 in the alignment part 130 measures the light energy absorption ratio.

The semiconductor wafer W subjected to the positioning in the alignment part 130 is taken out of the alignment part 130 into the transport chamber 170 by the upper transport arm 151a of the transport robot 150. The transport robot 150 pivots to face the heating treatment part 160.

After the transport robot 150 faces the heating treatment part 160, the lower transport arm 151b takes a preceding semiconductor wafer W subjected to the heat treatment out of the heating treatment part 160, and the upper transport arm 151a transports the untreated semiconductor wafer W into the heating treatment part 160. In this process, the transport robot 150 slides the transport arms 151a and 151b in a direction perpendicular to the longitudinal direction of the flash lamps 69.

Next, the transport robot 150 pivots to face the cooling part 140, and the lower transport arm 151b places the treated semiconductor wafer W into the cooling part 140. The semiconductor wafer W cooled down in the cooling part 140 is returned back to the cassette 91 by the transfer robot 120.

Figure 10:
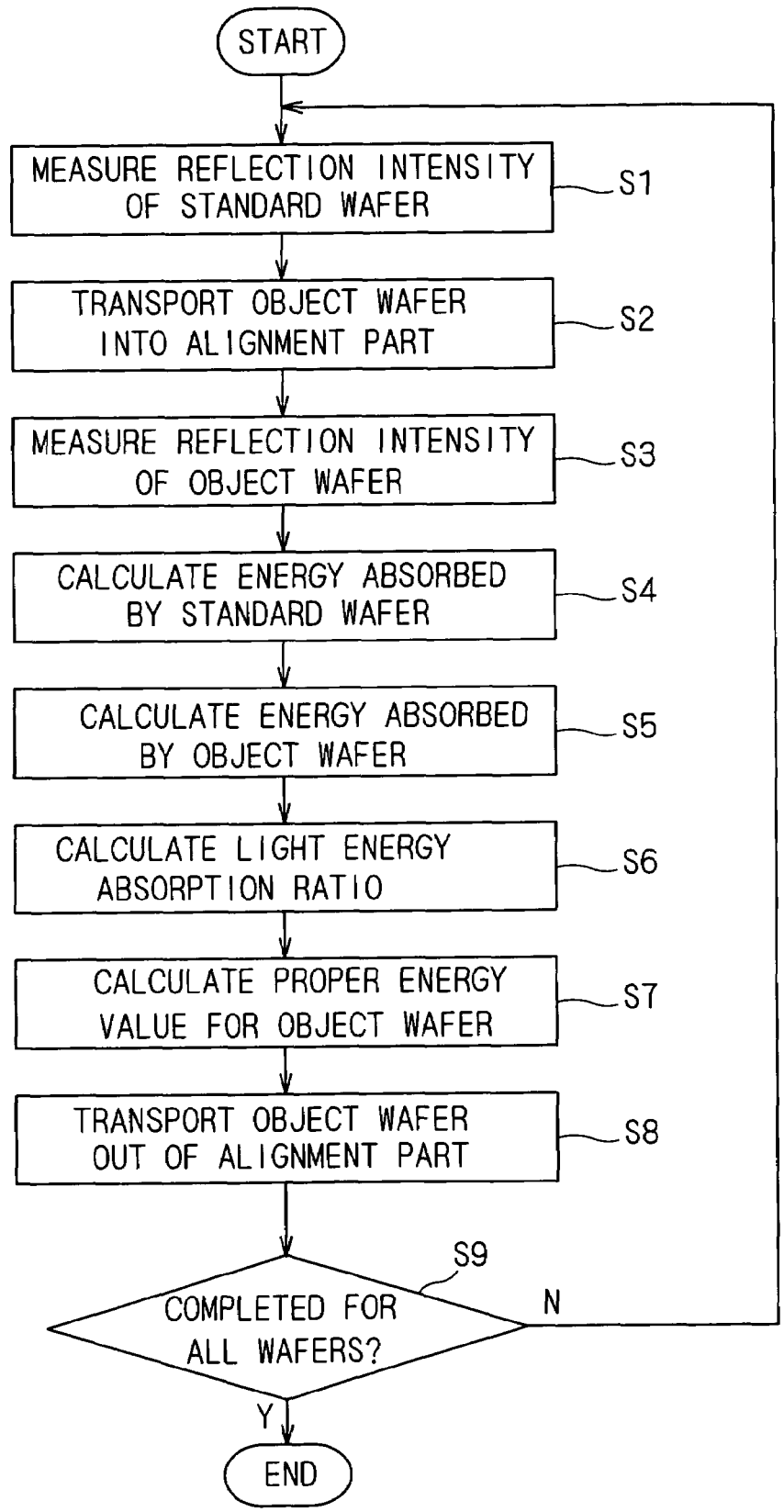
FIG. 10 is a flow chart showing a procedure for measuring the light energy absorption ratio of a semiconductor wafer in the alignment part.

FIG. 10 is a flow chart showing a procedure for measuring the light energy absorption ratio of a semiconductor wafer W in the alignment part 130. The reflected light intensity ratio and the light energy absorption ratio of the object semiconductor wafer W are measured in the alignment part 130. The reflected light intensity ratio of the object semiconductor wafer W refers to the ratio of the intensity of light reflected from the object semiconductor wafer W to that of light reflected from a standard wafer. The light energy absorption ratio of the object semiconductor wafer W refers to the ratio of light energy absorbed by the object semiconductor wafer W to that absorbed by the standard wafer. The standard wafer refers to a wafer serving as a standard relative to which the object semiconductor wafer W is compared, and exhibiting a known reflective behavior when exposed to light. An unpatterned bare wafer is used as the standard wafer in this preferred embodiment. The reflective behavior of the bare wafer when exposed to light from the light emitter 33 has been elucidated, and a proper energy value of a flash of light to be emitted from the flash lamps 69 has been known.

Prior to the transport of the object semiconductor wafer W into the alignment part 130, the intensity of reflected light obtained when the measuring optical system 31 directs light onto the standard wafer is measured (in Step S1). In this preferred embodiment, the bare wafer serving as the standard wafer is not transported into the alignment part 130, but the reflection intensity of the standard wafer is measured by using the calibration standard member 135. That is, the calibration standard member 135 is also an unpatterned bare wafer similar in surface property to the standard wafer assumed herein, and can be handled as the standard wafer. Thus, measuring the reflection intensity of the calibration standard member 135 is equivalent to measuring the reflection intensity of the standard wafer. Specifically, the light emerging from the measuring optical system 31 impinges upon the surface of the calibration standard member 135 because no semiconductor wafer W is supported by the support pins 133. The light reflected from the surface of the calibration standard member 135 is received by the measuring optical system 31 and is then subjected to the process of producing a spectrum by the spectroscope 35. As a result of this process, a spectral characteristic of the reflection intensity of the reflected light is inputted to the controller 3. The spectral characteristic of the reflection intensity of the calibration standard member 135 (i.e., the reflection intensity of the standard wafer) is referred to herein as a standard reflection intensity.

Next, the procedure proceeds to Step S2 in which the transfer robot 120 transports the object semiconductor wafer W into the alignment part 130 and places the object semiconductor wafer W onto the support pins 133. Then, the process of measuring the intensity of reflected light obtained when the measuring optical system 31 directs light onto the object semiconductor wafer W is carried out (in Step S3). Specifically, the semiconductor wafer W is supported by the support pins 133, whereby the light emerging from the measuring optical system 31 impinges upon the surface of the object semiconductor wafer W. The light reflected from the surface of the object semiconductor wafer W is received by the measuring optical system 31 and is then subjected to the process of producing a spectrum by the spectroscope 35. As a result of this process, a spectral characteristic of the reflection intensity of the reflected light is inputted to the controller 3. The spectral characteristic of the reflection intensity of the object semiconductor wafer W is referred to herein as an object substrate reflection intensity.

Figure 11:
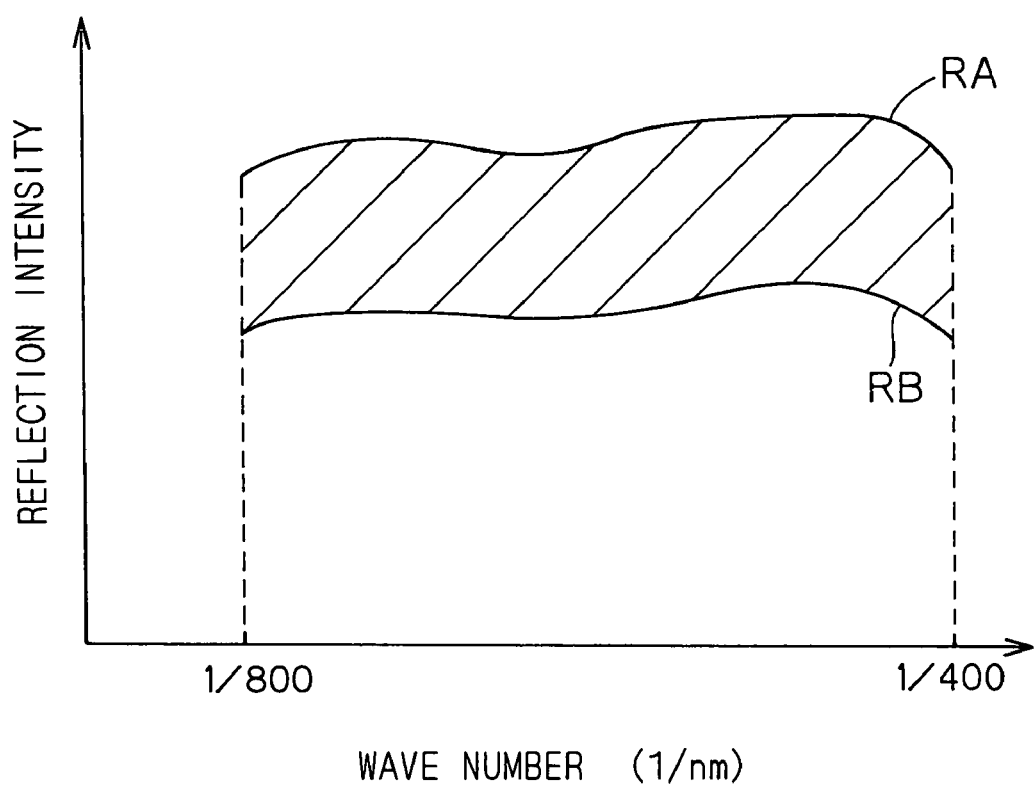
FIG. 11 illustrates light energy absorbed by a standard wafer.

After the completion of the measurement of the reflection intensity of the object semiconductor wafer W, the procedure proceeds to Step S4 in which the CPU 11 of the controller 3 calculates the light energy absorbed by the standard wafer. FIG. 11 illustrates the light energy absorbed by the standard wafer. The ordinate of FIG. 11 represents the reflection intensity, and the abscissa represents wave number (the reciprocal of wavelength). The integral of the reflection intensity in such a two-dimensional coordinate system is equal to the light energy of the reflected light. That is, the integral of the standard reflection intensity RB is equal to the light energy SB of the light reflected from the standard wafer.

The reflective behavior of the standard wafer is known, and it is possible to converting from the standard reflection intensity RB to the intensity (referred to hereinafter as an "ideal reflection intensity RA") of reflected light obtained when the measuring optical system 31 directs light onto an ideal mirror which provides 100% reflection of incident light. The CPU 11 of the controller 3 calculates the ideal reflection intensity RA from the standard reflection intensity RB obtained in Step S1, and also integrates the ideal reflection intensity RA to calculate the light energy SA of the light reflected from the ideal mirror. Because the ideal reflection intensity RA is an reflection intensity for a reflectivity of 100%, the light energy SA minus the light energy SB (or the area of the shaded region of FIG. 11) is calculated as the light energy absorbed by the standard wafer.

The range of the above-mentioned integration of the reflection intensity is from $\frac{1}{800}$ to $\frac{1}{400}$, i.e. the visible light range, for the following reason. The distribution of wavelengths of the flash lamps 69 ranges from ultraviolet to infrared regions, and the semiconductor wafer W of silicon is transparent to infrared radiation. In consideration for these facts, the wavelength region contributing to the heating of the semiconductor wafer W is selected.

Figure 12:
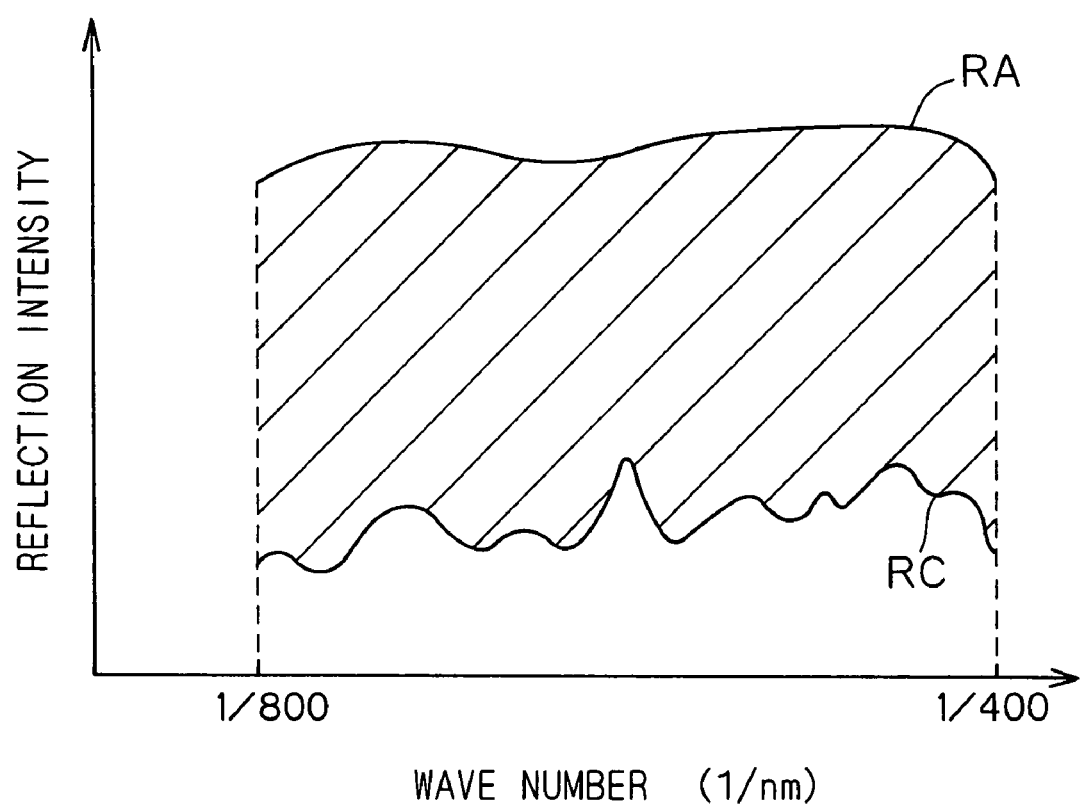
FIG. 12 illustrates light energy absorbed by a semiconductor wafer to be treated.

Next, the procedure proceeds to Step S5 in which the CPU 11 of the controller 3 calculates the light energy absorbed by the object semiconductor wafer W. FIG. 12 illustrates the light energy absorbed by the object semiconductor wafer W. In FIG. 12, the ideal reflection intensity RA is as described above, and the integral of the ideal reflection intensity RA is equal to the light energy SA of the light reflected from the ideal mirror having a reflectivity of 100%. The integral of the object substrate reflection intensity RC is equal to the light energy SC of the light reflected from the object semiconductor wafer W. Thus, the light energy SA minus the light energy SC (or the area of the shaded region of FIG. 12) is calculated as the light energy absorbed by the object semiconductor wafer W.

After the calculation of both the light energy absorbed by the standard wafer and the light energy absorbed by the object semiconductor wafer W, the CPU 11 of the controller 3 calculates the light energy absorption ratio of the object semiconductor wafer W to the standard wafer from the calculated light energy values (in Step S6). Specifically, the light energy absorption ratio r of the object semiconductor wafer W to the standard wafer is calculated by $$r = \frac{SA - SC}{SA - SB} \quad (1)$$

In parallel with this calculation, the controller 3 calculates the reflected light intensity ratio of the object semiconductor wafer W to the standard wafer. Specifically, the reflected light intensity ratio R of the object semiconductor wafer W to the standard wafer is calculated by $$R = \frac{RC}{RB} \quad (2)$$

In general, the object semiconductor wafer W absorbs more light than the unpatterned bare wafer. Thus, RB>RC and SB>SC under normal conditions. As a result, r>1 and R<1.

This enables the simple optical system to easily measure the light energy absorption ratio r and the reflected light intensity ratio R of the object semiconductor wafer W to the standard wafer.

After the light energy absorption ratio r of the object semiconductor wafer W to the standard wafer is calculated in a manner as described above, this preferred embodiment calculates a proper value of the energy of light to be directed from the flash lamps 69 onto the object semiconductor wafer W (in Step S7). As discussed above, the energy value of the flash of light emitted from the flash lamps 69 is adjusted based on the result of measurement of the post-processing characteristic (e.g., sheet resistance and the like) obtained after the unpatterned bare wafer is implanted with ions and actually exposed to a flash of light. In other words, the proper value of the energy of light to be directed onto the bare wafer serving as the standard wafer is known. The proper value of the energy of light for exposure is an energy value necessary and sufficient for the activation of ions without damages to the wafer, and typically ranges from about 25 J/cm$^2$ to about 28 J/cm$^2$ for the bare wafer.

However, the object semiconductor wafer W absorbs more light than the bare wafer. If an energy value is proper for the bare wafer, exposing the actual object semiconductor wafer to a flash of light whose energy value is equal to the above-mentioned energy value might increase the surface temperature to a level higher than expected to cause cracks in the wafer, as discussed above.

To avoid such a problem, the CPU 11 of the controller 3 in this preferred embodiment calculates the proper value of the energy of the flash of light to be directed onto the object semiconductor wafer W based on the proper value of the energy of light to be directed onto the bare wafer and the above-mentioned light energy absorption ratio r, and controls the lamp power supply 99 to emit a flash of light so that the proper value is attained. Specifically, the CPU 11 of the controller 3 calculates the proper value EC of the energy of the flash of light to be directed onto the object semiconductor wafer W, based on the following calculation:

$$EC = \frac{1}{r} \cdot EB \quad (3)$$

where EB is the proper value of the energy of light to be directed onto the bare wafer. The proper energy value EB is previously determined by experiment or in simulation, as discussed above. Thus, the proper value EC of the energy of light to be directed onto the object semiconductor wafer W is calculated from the proper value EB of the energy of light to be directed onto the bare wafer and the light energy absorption ratio r. Because r>1, EC<EB under normal conditions.

After the calculation of the proper value EC of the energy of light to be directed onto the object semiconductor wafer W, the CPU 11 of the controller 3 controls the lamp power supply 99 to emit a flash of light from the light emitting part 5 so that the proper value EC is attained. Specifically, the voltage on the capacitor connected to the electrodes of each of the flash lamps 69 is adjusted in accordance with an instruction from the controller 3. The voltage on the capacitor determines the amount of charge which in turn determines the energy value of the flash of light emerging from each of the flash lamps 69.

Thereafter, the procedure proceeds to Step S8 in which the transport robot 150 transports the object semiconductor wafer W out of the alignment part 130. The semiconductor wafer W is, of course, rotated and positioned prior to the transport out of the alignment part 130.

Subsequently, the procedure proceeds to Step S9. If not all of the object semiconductor wafers W are subjected to the above-mentioned series of processes in Step S9, the procedure returns to Step S1. Specifically, the transport of the object semiconductor wafer W out of the alignment part 130 causes the light emerging from the measuring optical system 31 to impinge upon the surface of the calibration standard member 135 again. As a result, the process in Step S1 can be performed only by transporting the object semiconductor wafer W out of the alignment part 130 without the need to especially transport the standard wafer into the alignment part 130. Each time an object semiconductor wafer W is transported out of the alignment part 130, light is directed from the measuring optical system 31 onto the calibration standard member 135, and the reflection intensity of the calibration standard member 135 is obtained.

The treatment operation in the heating treatment part 160 will be further described. In the heating treatment part 160, the activation of impurities implanted in a semiconductor wafer W is performed by flash heat treatment. First, the holding part 7 is placed in a position close to the chamber bottom portion 62, as shown in FIG. 3. The position of the holding part 7 shown in FIG. 3 within the chamber 6 is referred to hereinafter as a "transfer position." When the holding part 7 is in the transfer position, the upper ends of the support pins 70 protrude through the holding part 7 upwardly out of the holding part 7.

Next, the valve 82 and the valve 87 are opened to introduce nitrogen gas at room temperature into the heat treatment space 65 of the chamber 6. Subsequently, the transport opening 66 is opened, and the transport robot 150 outside the heating treatment part 160 transports the object semiconductor wafer W through the transport opening 66 into the chamber 6 and places the object semiconductor wafer W onto the plurality of support pins 70.

The amount of nitrogen gas fed into the chamber 6 during the transport of the semiconductor wafer W into the chamber 6 shall be about 40 liters per minute. The nitrogen gas fed in the chamber 6 flows from the gas inlet buffer 83 in a direction indicated by the arrow AR4 of FIG. 4, and is exhausted through the outlet passage 86 and the valve 87 shown in FIG. 3 by using a utility exhaust system. Part of the nitrogen gas fed into the chamber 6 is also exhausted from an exhaust port (not shown) provided inside the bellows 47. In steps to be described below, the nitrogen gas always continues to be fed into and exhausted from the chamber 6, and the amount of nitrogen gas fed into the chamber 6 is changed to various amounts in accordance with the process steps of the semiconductor wafer W.

Figure 6:
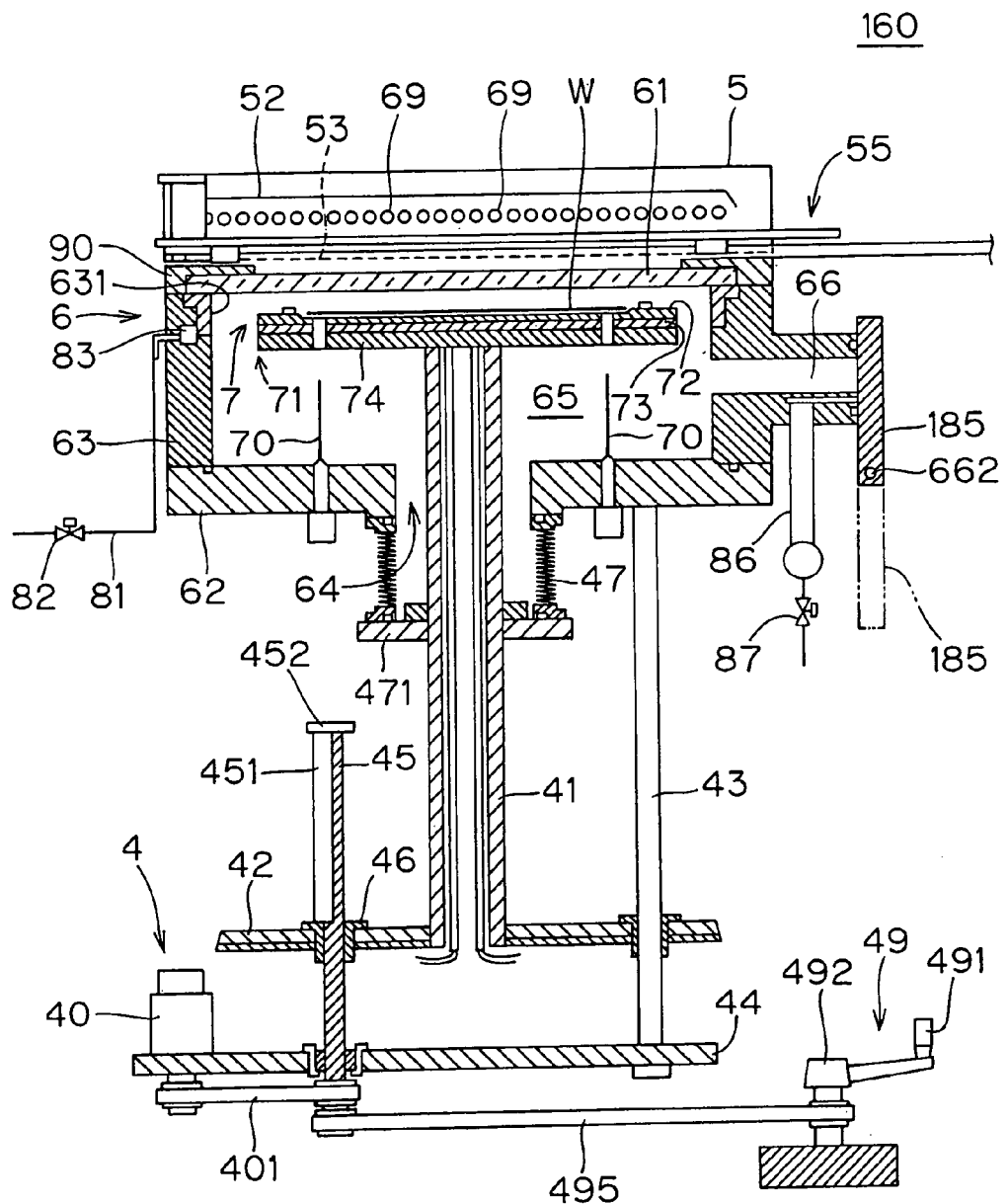
FIG. 6 is a side sectional view showing the construction of the heating treatment part in the heat treatment apparatus of FIG. 1.

After the semiconductor wafer W is transported into the chamber 6, the gate valve 185 closes the transport opening 66. Next, as shown in FIG. 6, the holding part elevating mechanism 4 moves the holding part 7 upwardly to a position (referred to hereinafter as a "heat treatment position") close to the light-transmittable plate 61. Then, the semiconductor wafer W is transferred from the support pins 70 to the susceptor 72 of the holding part 7, and is placed and held on the upper surface of the susceptor 72.

Each of the six zones 711 to 716 of the hot plate 71 is already heated up to a predetermined temperature by the resistance heating wires individually provided within the zones 711 to 716 (between the upper plate 73 and the lower plate 74). The holding part 7 is moved upwardly to the heat treatment position and the semiconductor wafer W comes in contact with the holding part 7, whereby the semiconductor wafer W is preheated and the temperature of the semiconductor wafer W increases gradually.

Preheating the semiconductor wafer W in the heat treatment position for about 60 seconds increases the temperature of the semiconductor wafer W up to a previously set preheating temperature T1. The preheating temperature T1 shall range from about 200° C. to about 600° C., preferably from about 350° C. to about 550° C., at which there is no apprehension that the impurities implanted in the semiconductor wafer W are diffused by heat. A distance between the holding part 7 and the light-transmittable plate 61 is adjustable to any value by controlling the amount of rotation of the motor 40 of the holding part elevating mechanism 4.

After a lapse of the preheating time of about 60 seconds, a flash of light is emitted from the light emitting part 5 toward the semiconductor wafer W under the control of the controller 3 while the holding part 7 remains in the heat treatment position. At this time, the emission of the flash of light from the flash lamps 69 is carried out so that the energy of light directed onto the semiconductor wafer W takes on the proper value EC previously calculated in a manner as described above. Part of the light emitted from the flash lamps 69 of the light emitting part 5 travels directly to the interior of the chamber 6. The remainder of the light is reflected by the reflector 52, and the reflected light travels to the interior of the chamber 6. Such emission of the flash of light achieves the flash heating of the semiconductor wafer W. The flash heating, which is achieved by the emission of a flash of light from the flash lamps 69, can raise the surface temperature of the semiconductor wafer W in a short time.

Specifically, the light emitted from the flash lamps 69 of the light emitting part 5 is an intense flash of light emitted for an extremely short period of time ranging from about 0.1 millisecond to about 10 milliseconds because the previously stored electrostatic energy is converted into such an ultrashort light pulse. The surface temperature of the semiconductor wafer W subjected to the flash heating by the emission of the flash of light from the flash lamps 69 momentarily rises to a heat treatment temperature T2 of about 1000° C. to about 1100° C. After the impurities implanted in the semiconductor wafer W are activated, the surface temperature decreases rapidly. Because of the capability of increasing and decreasing the surface temperature of the semiconductor wafer W in an extremely short time, the heating treatment part 160 can achieve the activation of the impurities while suppressing the diffusion of the impurities implanted in the semiconductor wafer W due to heat. Such a diffusion phenomenon is also known as a round or dull profile of the impurities implanted in the semiconductor wafer W. Because the time required for the activation of the implanted impurities is extremely short as compared with the time required for the thermal diffusion of the implanted impurities, the activation is completed in a short time ranging from about 0.1 millisecond to about 10 milliseconds during which no diffusion occurs.

The emission of the flash of light from the flash lamps 69 is carried out so that the energy of light directed onto the object semiconductor wafer W takes on the proper value EC. This accomplishes the activation of the ions without damages to the semiconductor wafer W during the heat treatment.

Preheating the semiconductor wafer W by the holding part 7 prior to the flash heating allows the emission of the flash of light from the flash lamps 69 to rapidly increase the surface temperature of the semiconductor wafer W up to the heat treatment temperature T2.

After waiting in the heat treatment position for about 10 seconds following the completion of the flash heating, the holding part 7 is moved downwardly again to the transfer position shown in FIG. 3 by the holding part elevating mechanism 4, and the semiconductor wafer W is transferred from the holding part 7 to the support pins 70. Subsequently, the gate valve 185 opens the transport opening 66 having been closed, and the transport robot 150 outside the heating treatment part 160 transports the semiconductor wafer W placed on the support pins 70 outwardly. Thus, the flash heating treatment of the semiconductor wafer W in the heating treatment part 160 is completed.

As discussed above, the nitrogen gas is continuously fed into the chamber 6 during the heat treatment of the semiconductor wafer W in the heating treatment part 160. The amount of nitrogen gas fed into the chamber 6 shall be about 30 liters per minute when the holding part 7 is in the heat treatment position, and be about 40 liters per minute when the holding part 7 is in other than the heat treatment position.

As described hereinabove, this preferred embodiment uses the reflection intensity of the standard wafer as a reference value to calculate the light energy absorption ratio r and the reflected light intensity ratio R based on the result of the relative comparison between the reference value and the reflection intensity of the object semiconductor wafer W, finally calculating the proper value EC of the energy of light to be directed onto the object semiconductor wafer W. As already mentioned, a device for performing various computation by using such a relative comparison between the reference value and the measured value necessitates the process of measuring the reflection intensity of the standard wafer at regular time intervals to set the measured result as the reference value again, that is, the calibration process executed in Step S1 of FIG. 10, for example, in order to respond to factors of variations with time, such as aged deterioration, of the lamp of the light emitter 33.

In this preferred embodiment, the calibration standard member 135 is fixedly installed in the chamber 131 of the alignment part 130, whereby the calibration is done by using the calibration standard member 135. Further, the calibration standard member 135 is placed in the optical path of the light emerging from the measuring optical system 31, and is in such a position that the light emerging from the measuring optical system 31 impinges upon the semiconductor wafer W when the semiconductor wafer W is supported by the support pins 133 and impinges upon the calibration standard member 135 when no semiconductor wafer W is supported by the support pins 133. The calibration can be done whenever there is no semiconductor wafer W in the alignment part 130. In other words, the calibration can be done only by transporting the object semiconductor wafer W out of the alignment part 130. It is possible, for example, to do the calibration to execute the processes in Steps S2 to S7 of FIG. 10 each time a semiconductor wafer W is transported out of the alignment part 130. Of course, the calibration in Step S1 may be carried out either each time a fixed number of semiconductor wafers W are treated or at fixed time intervals.

It is hence unnecessary to transport standard wafers one by one into the alignment part 130 for the execution of the calibration. This consequently eliminates the need to stop the actual operation of the heat treatment apparatus 100 in order to do the calibration, thereby achieving improvements in throughput, and also significantly facilitates the calibration process. Additionally, there is no apprehension about the generation of particles and the like because of the absence of any mechanically driven element during the calibration. The calibration process in Step S1 of FIG. 10 requires about several milliseconds. This makes it possible to carry out the calibration during the time interval between the normal wafer processes in the alignment part 130 (or between transporting a semiconductor wafer W out of the alignment part 130 and transporting the next semiconductor wafer W into the alignment part 130). In ordinary cases, the lamp of the light emitter 33 always remains on while the heat treatment apparatus 100 is in operation so that the lifetime of the lamp lasts as long as possible. This allows the execution of the calibration process simply by transporting the semiconductor wafer W out of the alignment part 130.

<5. Modifications>

While the preferred embodiment according to the present invention has been described hereinabove, the present invention is not limited to the above-mentioned specific embodiment. As an example, the proper value of the energy of light to be directed onto the object semiconductor wafer is calculated from the light energy absorption ratio of the object semiconductor wafer W to the standard wafer in the above-mentioned preferred embodiment. Instead, the temperature that the semiconductor wafer W is expected to reach during the heat treatment may be calculated by a technique similar to that disclosed in Japanese Patent Application Laid-Open No. 2005-39213.

Although the 30 flash lamps 69 are provided in the light emitting part 5 according to the above-mentioned preferred embodiment, the present invention is not limited to this. Any number of flash lamps 69 may be provided.

The flash lamps 69 are not limited to the xenon flash lamps but may be krypton flash lamps.

The technique according to the present invention is applicable to a heat treatment apparatus which comprises the light emitting part 5 including other types of lamps (e.g., halogen lamps) in place of the flash lamps 69 and which heats the semiconductor wafer W by exposing the semiconductor wafer W to light emitted from the lamps. Such a modification also allows the calculation of the proper value of the energy of light to be directed onto the object semiconductor wafer W from the light energy absorption ratio of the object semiconductor wafer W to the standard wafer, and the calculation of the temperature that the semiconductor wafer W is expected to reach during the heat treatment.

Although the two cassettes 91 are placed on the indexer part 110 in the above-mentioned preferred embodiment, the number of cassettes 91 placed on the indexer part 110 may be either one or greater than two. Although the transfer robot 120 is configured to move between the two cassettes 91, two transfer robots 120 may be provided.

The upper transport arm 151*a* of the transport robot 150 may be designed as an arm for holding untreated semiconductor wafers W only whereas the lower transport arm 151*b* be designed as an arm for holding treated semiconductor wafers W only. This achieves the size reduction of the transport robot 150 and the improvements in transport reliability.

In the above-mentioned preferred embodiment, the bare wafer is used as the standard wafer, and the calibration standard member 135 is also the bare wafer. The present invention, however, is not limited to this. The standard wafer may be a member exhibiting a known reflective behavior when exposed to light and having good reproducibility of the reflective behavior. For example, an optical standard mirror may be used as the standard wafer. In this case, a member similar in surface property to the standard wafer is, of course, used as the calibration standard member 135.

The optical measuring unit 30 need not be provided in the alignment part 130, but may be provided in any position lying in the path of the transport of the semiconductor wafer W from the indexer part 110 to the heating treatment part 160.

In the above-mentioned preferred embodiment, the ion activation process is performed by exposing the semiconductor wafer to light. The substrate to be treated by the heat treatment apparatus according to the present invention is not limited to the semiconductor wafer. For example, the heat treatment apparatus according to the present invention may perform the heat treatment on a glass substrate formed with various silicon films including a silicon nitride film, a polycrystalline silicon film and the like. As an example, silicon ions are implanted into a polycrystalline silicon film formed on a glass substrate by a CVD process to form an amorphous silicon film, and a silicon oxide film serving as an anti-reflection film is formed on the amorphous silicon film. In this state, the heat treatment apparatus according to the present invention may expose the entire surface of the amorphous silicon film to light to polycrystallize the amorphous silicon film, thereby forming a polycrystalline silicon film.

Another modification may be made in a manner to be described below. A TFT substrate is prepared such that an underlying silicon oxide film and a polysilicon film produced by crystallizing amorphous silicon are formed on a glass substrate and the polysilicon film is doped with impurities such as phosphorus or boron. The heat treatment apparatus according to the present invention may expose the TFT substrate to light to activate the impurities implanted in the doping step.

While the invention has been described in detail, the foregoing description is in all aspects illustrative and not restrictive. It is understood that numerous other modifications and variations can be devised without departing from the scope of the invention.

What is claimed is:

1. A reflected light intensity ratio measuring device for measuring a reflected light intensity ratio of an object substrate to be treated relative to a standard substrate, comprising:

a chamber for receiving the object substrate therein, said chamber permanently holding thereon a calibration standard member which is similar in surface property to the standard substrate during continuous processing of said object substrate;

a substrate holding part for holding the object substrate within said chamber;

a light emitting and receiving part fixed to said chamber for directing light onto a main surface of the object substrate held by said substrate holding part or onto said calibration standard member and for receiving light reflected from the main surface or from said calibration standard member, and said calibration standard member being located in an optical path of light emerging from the light emitting and receiving part, and a calculation part for calculating the reflected light intensity ratio of the object substrate to the standard substrate from the intensity of reflected light obtained when light, is directed from said light emitting and receiving part onto said calibration standard member and the intensity of reflected light obtained when light is directed onto the object substrate, said calibration standard member being placed in such a position that the light emerging from said light emitting and receiving part impinges upon the object substrate when the object substrate is held by said substrate holding part and impinges upon said calibration standard member when no object substrate is held by said substrate holding part.

2. The reflected light intensity ratio measuring device according to claim 1, wherein:

said substrate holding part includes a plurality of support pins for supporting said object substrate from below, and a support table horizontally laid between said plurality of support pins;

said light emitting and receiving part is provided in a position directly over said substrate holding part in a ceiling portion of said chamber; and said calibration standard member is placed on an upper surface of said support table.

3. A measuring device for measuring a light energy absorption ratio of an object substrate to be treated to a standard substrate, comprising:

a chamber for receiving the object substrate therein, said chamber comprises a calibration standard member being similar in surface property to the standard substrate, wherein said chamber permanently holds said calibration standard member during continuous processing of said object substrate;

a substrate holding part for holding the object substrate within said chamber;

a light emitting and receiving part fixed to said chamber for directing light onto a main surface of the object substrate held by said substrate holding part or said calibration standard member and for receiving light reflected from the main surface or said calibration standard member, and said calibration standard member being located in an optical path of light emerging from the light emitting and receiving part, and a calculation part for calculating the light energy absorption ratio of the object substrate to the standard substrate from the intensity of reflected light obtained when light is directed from said light emitting and receiving part onto said calibration standard member and the intensity of reflected light obtained when light is directed onto the object substrate, said calibration standard member being placed in such a position that the light emerging from said light emitting and receiving part impinges upon the object substrate when the object substrate is held by said substrate holding part and impinges upon said calibration standard member when no object substrate is held by said substrate holding part.

4. The measuring device according to claim 3, wherein:

said substrate holding part includes a plurality of support pins for supporting said object substrate from below, and a support table horizontally laid between said plurality of support pins;

said light emitting and receiving part is provided in a position directly over said substrate holding part in a ceiling portion of said chamber; and said calibration standard member is placed on an upper surface of said support table.

5. A heat treatment apparatus for exposing an object substrate to be treated to light to heat the object substrate, said heat treatment apparatus comprising:

a) a measuring part including a-1) a measuring chamber for receiving the object substrate therein, said chamber comprises a calibration standard member being similar in surface property to the standard substrate and wherein said chamber permanently holds said calibration standard member during continuous processing of said object substrate, a-2) a substrate holding part for holding the object substrate within said measuring chamber, a-3) a light emitting and receiving part fixed to said measuring chamber for directing light onto a main surface of the object substrate held by said substrate holding part or said calibration standard member and for receiving light reflected from the main surface or said calibration standard member, and said calibration standard member being located in an optical path of light emerging from the light emitting and receiving part, and a-4) a calculation part for calculating a light energy absorption ratio of the object substrate to the standard substrate from the intensity of reflected light obtained when light is directed from said light emitting and receiving part onto said calibration standard member and the intensity of reflected light obtained when light is directed onto the object substrate, said calibration standard member being placed in such a position that the light emerging from said light emitting and receiving part impinges upon the object substrate when the object substrate is held by said substrate holding part and impinges upon said calibration standard member when no object substrate is held by said substrate holding part;

b) a heating treatment part including b-1) an exposure element for exposing the object substrate to light, b-2) a heat treatment chamber provided under said exposure element and including a chamber window provided in an upper portion of said heat treatment chamber, said chamber window allowing the light emerging from said exposure element to travel therethrough, and b-3) a susceptor for holding the object substrate within said heat treatment chamber; and c) a transport robot for transporting the object substrate from said measuring part to said heating treatment part.

6. The heat treatment apparatus according to claim 5, wherein:

said substrate holding part includes a plurality of support pins for supporting said object substrate from below, and a support table horizontally laid between said plurality of support pins;

said light emitting and receiving part is provided in a position directly over said substrate holding part in a ceiling portion of said measuring chamber; and said calibration standard member is placed on an upper surface of said support table.

7. The heat treatment apparatus according to claim 5, wherein each time said transport robot transports an object substrate out of said measuring part, said measuring part directs light from said light emitting and receiving part onto said calibration standard member to obtain the intensity of light reflected from said calibration standard member.

8. The heat treatment apparatus according to claim 5, further comprising:

a light energy control element for adjusting the energy of light to be directed from said exposure element onto said object substrate to a proper value, based on a proper energy value of light to be directed onto said standard substrate and the light energy absorption ratio determined by said measuring part.

* * * * *